United States Patent
Tang et al.

(10) Patent No.: US 6,710,605 B2
(45) Date of Patent: Mar. 23, 2004

(54) METHOD AND APPARATUS FOR DETECTING VALID SIGNAL INFORMATION

(75) Inventors: Benjamin Tang, Hawthorne, CA (US); Keith Nelson Bassett, Torrance, CA (US)

(73) Assignee: Primarion, Inc., Tempe, AZ (US)

( * ) Notice: Subject to any disclaimer, the term of this patent is extended or adjusted under 35 U.S.C. 154(b) by 18 days.

(21) Appl. No.: 10/003,491

(22) Filed: Nov. 1, 2001

(65) Prior Publication Data

US 2002/0075012 A1 Jun. 20, 2002

Related U.S. Application Data

(60) Provisional application No. 60/245,043, filed on Nov. 1, 2000.

(51) Int. Cl.[7] .............................................. G01R 29/26
(52) U.S. Cl. ................. 324/614; 324/158.1; 324/613; 327/72; 340/310.01
(58) Field of Search ................ 340/310.01, 310.06; 375/340, 317; 327/72, 77, 78; 324/158.1, 765, 609, 613, 647, 314, 614

(56) References Cited

U.S. PATENT DOCUMENTS

| 4,783,658 A | 11/1988 | Nakano et al. ............ 340/10.3 |
| 5,687,321 A | 11/1997 | Allen ........................ 709/224 |
| 6,045,927 A | * 4/2000 | Nakanishi et al. .......... 428/614 |

FOREIGN PATENT DOCUMENTS

| WO | WO 98/28846 | 7/1998 |

* cited by examiner

*Primary Examiner*—N. Le
*Assistant Examiner*—Vincent Q. Nguyen
(74) *Attorney, Agent, or Firm*—Theodore E. Galanthay

(57) ABSTRACT

An apparatus and method for detecting the presence of a valid signal includes an offset generator coupled to a pair of data slicers and an XOR gate. The offset generator is configured to both add and subtract a predetermined voltage to an input voltage in its two outputs. The two outputs of the offset generator are both compared to a predetermined value in a pair of data slicers. If the outputs of the data slicers are the same (i.e., either both offset signals are positive or both are negative), then a valid signal is indicated.

49 Claims, 5 Drawing Sheets

METHOD AND APPARATUS FOR DETECTING VALID SIGNAL INFORMATION

CROSS-REFERENCE TO RELATED APPLICATIONS

This application claims priority from U.S. Provisional Application Ser. No. 60/245,043, filed Nov. 1, 2000.

BACKGROUND OF THE INVENTION

1) Technical Field

The present invention generally relates to microelectronic circuits. More particularly, the present invention relates to a circuit configured to differentiate a "valid" transmitted signal from noise signals transmitted over a transmission line.

2) Background of the Invention

When electronic signals are transmitted from one location to another along a line (e.g., a fiber optic cable or the like), electronic noise is often also transmitted with the signal along the line. In many cases, it is desirable to determine when a "valid" electronic signal from a transmission source, rather than just electronic noise, is transmitted over the line. For example, circuits such as clock and data recovery require a valid data input to operate properly. It is often necessary to first determine if the data signal is being properly transmitted. Accordingly, a circuit that is able to detect whether a "valid" signal is transmitted is desired.

SUMMARY OF THE INVENTION

A circuit for the detection of a valid signal on a line of the present invention includes an offset generator, a pair of data slicers, and an XOR gate. The circuit may also contain, for purposes of smoothing the response of the circuit, a low-pass filter and a Schmitt trigger.

BRIEF DESCRIPTION OF THE DRAWINGS

The present invention is illustrated by way of example and not limitation in the accompanying figures, in which like references indicate similar elements, and in which.

DETAILED DESCRIPTION

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes, inductors, and the like, whose values may be suitably configured for various intended purposes. In addition, the present invention may be practiced in any integrated circuit application where a detection of a small amplitude signal is desired. Such general applications, that may be appreciated by those skilled in the art in light of the present disclosure, are not described in detail herein. Further, it should be noted that while various components may be suitably coupled or connected to other components within exemplary circuits, such connections and couplings can be realized by direct connection between components, or by connection through other components and devices located therebetween.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

Figure 1:
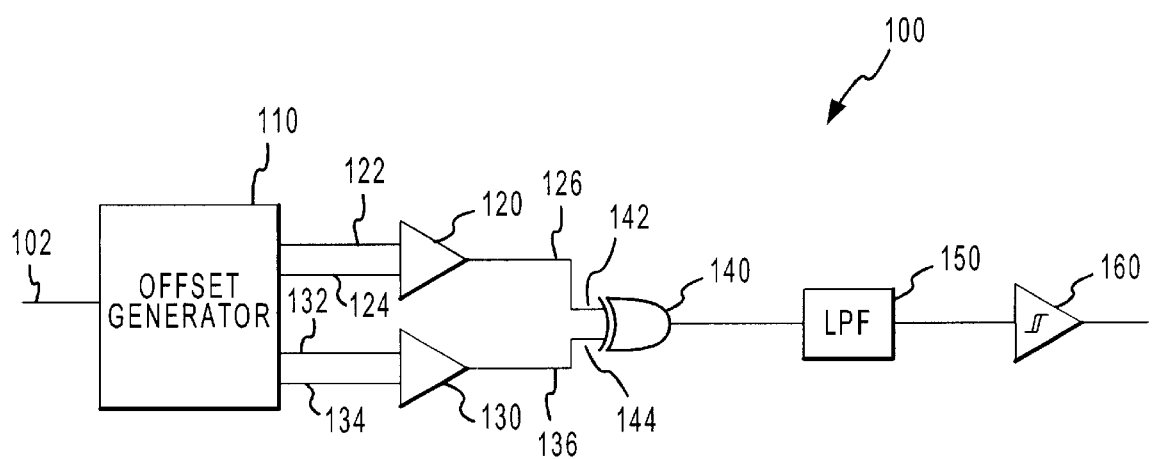
FIG. 1 is a schematic illustration circuit to detect a valid signal in accordance with one embodiment of the invention.

FIG. 1 illustrates a signal detection circuit 100 in accordance with the present invention. Circuit 100 includes an offset generator 110, data slicers 120 and 130, an exclusive OR ("XOR") gate 140, a low pass filter 150, and a Schmitt trigger 160.

In operation, circuit 100 determines if an input signal 102 contains valid data or undesirable components, such as noise. Input signal 102 is received by offset generator 110. At generator 110, a positive offset and a negative offset are added to the incoming signal. The signal with the negative offset travels to data slicer 120 and the signal with the positive offset travels to data slicer 130. Preferably, the value of the added offset is less than a voltage that indicates a valid signal. For example, if a 100 mV differential represents a valid logical 1 level, the offset may be configured to be 50 mV. In such a manner, noise on the line will typically not be brought over the threshold of a valid signal value with the addition of the offset voltage.

Data slicers 120 and 130 are each configured with two inputs, inputs 122 and 124 for slicer 120 and inputs 132 and 134 for slicer 130. Data slicers 120 and 130 each contain a single output, outputs 126 and 136, respectively. Data slicers 120 and 130 may include a wideband limiting amplifier that operates in a manner similar to a comparator. However, while a comparator is usually bandwidth limited to minimize noise and improve sensitivity, a data slicer is generally not bandwidth limited in order to pass the highest possible data rate. Data slicers 120 and 130 are configured to produce one of two outputs depending on which input has a higher voltage. For example, if input 122 has a higher voltage than input 124, output 126 may be a high voltage level. On the other hand, if input 124 has a higher voltage level, output 126 may be a low voltage level.

The outputs from slicers 120 and 130 are transmitted to the inputs of XOR gate 140, input 142 and input 144. As is known in the art, an XOR gate produces a high output (i.e., a logical 1) only if the two inputs to the XOR gate are not equal. Thus, if both input 142 and input 144 are at a low level or if they are both at a high level, the output 146 of XOR gate 140 is low (i.e., a logical 0), otherwise the output is high, as illustrated in the following Table 1:

TABLE 1

| 142 | 144 | 146 |
|---|---|---|
| 0 | 0 | 0 |
| 0 | 1 | 1 |
| 1 | 0 | 1 |
| 1 | 1 | 0 |

From XOR gate 140, the signal passes through low pass filter 150, which filters the high frequencies from the signal, and then through Schmitt trigger 160. Schmitt trigger 160 is configured as a circuit with hysteresis. That is, Schmitt trigger 160 is bistable with 2 stable conditions. Such a circuit serves to smooth the response of circuit 100 such that the detection of a valid signal is more accurate. The hysteresis prevents on/off triggering from slight variations in signal amplitude.

The output of Schmitt trigger 160 indicates whether the data input contains a signal that sufficiently exceeds the threshold set in the offset generation circuit 110. Since the output need only indicate whether a signal is detected or not, circuit 100 can generate an output of either polarity (i.e., a "0" can represent no signal while a "1" can represent a valid signal, or vice versa). The signal is typically referred to as a signal detect if "1" represents a valid signal, or a loss-of-signal if "0" represents a valid signal. Since the output polarity does not impact the overall functionality of the circuit, the signal path may contain inversions without affecting the operation of the circuit (other than the polarity of the output signal). Thus, data slicers 120 and 130 may be inverting or non-inverting, and XOR gate 140 may be replaced by an XNOR gate.

The operation of signal detector 100 will now be described in more detail. Differential input signal 102 is processed by offset generator 110 and two signals are produced, the original signal less a predetermined offset voltage and the original signal plus a predetermined offset voltage. The offset voltage is typically configured such that the addition of the offset to an invalid signal will not be sufficient to activate the circuit. For example, if a +100 mV differential signal corresponds to a logical 1 and a −100 mV differential signal corresponds to a logical 0, offset generator 110 may be configured to generate an offset voltage of +/−50 mV.

Thus, when a logic 1 differential signal of +100 mV is present at input 102, differential signals of +150 mV and +50 mV are supplied to data slicers 120 and 130, respectively. Thus, the outputs of data slicers 120 and 130 will both be logical 1, resulting in a logical 0 output of XOR gate 140, indicating the presence of a valid signal. When a logic 0 signal of −100 mV is present at input 102, differential signals of −50 mV and −150 mV are input to data slicers 120 and 130, respectively. Thus, the outputs of data slicers 120 and 130 will both be logical 0 resulting in a logical 0 output of XOR gate 140, indicating the presence of a valid signal. When differential noise of 30 mV is present at input 102, the outputs of offset generator 110 are 80 mV and −20 mV. These two signals are input into data slicers 120 and 130, respectively, resulting in an output of 1 and 0, respectively. Thus, the output of XOR gate 140 would be a logic 1, indicating a loss of signal. Low-pass filter 150 and Schmitt trigger 160 serve to ensure that the signal from XOR gate 140 is correct by smoothing transients in the output of XOR gate 140.

Figure 2:
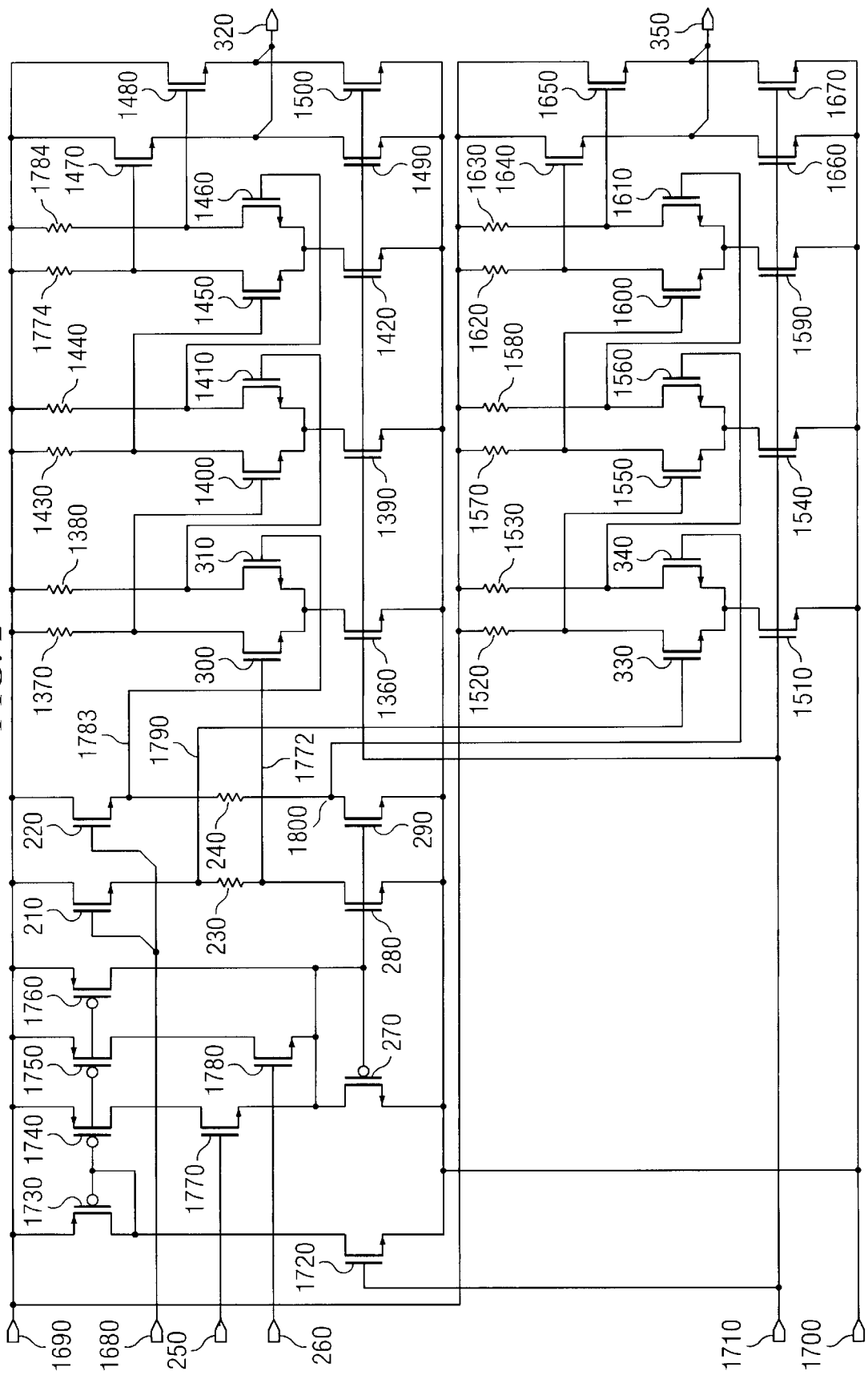
FIG. 2 is a more detailed schematic illustration of a portion of the circuit illustrated in FIG. 1.

FIG. 2 illustrates the construction of offset generator 110 and slicers 120 and 130 in greater detail.

A differential input to the variable offset generator is provided at port 1680. The differential signal propagates to transistors 210 and 220.

Port 1710 provides a bias voltage that biases up current sink transistors 1360, 1390, 1420, 1490, 1500, 1510, 1540, 1590, 1660, 1670, and 1720. The voltage Vb is obtained by a reference current and a mirror transistor (not shown) scaled to the current sink transistors to obtain the desired drain currents.

In accordance with one aspect of the invention, the offset may be variably controlled. For example, FIG. 2 shows two additional inputs 250 and 260 connected to input transistors 1770 and 1780. By controlling the voltages at inputs 250 and 260, various amounts of offset voltages can be created. In an exemplary embodiment, a low voltage at both inputs 250 and 260 results in an offset of 56 mV; a high voltage at input 250 and a low voltage at input 260 results in an offset of 104 mV; a low voltage at input 250 and a high voltage at input 260 results in an offset of 132 mV; and a high voltage at both inputs 250 and 260 results in an offset of 180 mV.

This variable offset across resistors 230 and 240 is generated through scaling of the current reference in the current sink transistor 1720. The drain current in transistor 1720 is mirrored by transistor 1730 to transistors 1740, 1750, and 1760, where transistor 1740 is scaled to twice the current in 1750 and 1760. Control inputs at ports 250 and 260 turn off the current in transistors 1740 and 1750 respectively. The current in transistors 1740, 1750, and 1760 are summed into transistor 270 and mirrored to transistors 280 and 290, which set the current in resistors 230 and 240, generating a negative offset to node pair 1772 and 1782, and a positive offset to node pair 1790 and 1800, which correspond to the inputs of differential slicers 120 and 130 in FIG. 1, respectively.

Slicer 120 consists of three stages of differential amplifiers with a source follower output. Transistors 300 and 310 constitute the first stage differential pair along with load resistors 1370 and 1380 and current sink transistor 1360. Transistors 1400 and 1410 constitute the second stage differential pair along with load resistors 1430 and 1440 and current sink transistor 1390. Transistors 1450 and 1460 constitute the first stage differential pair along with load resistors 1774 and 1784 and current sink transistor 1420. Transistors 1470 and 1480 constitute the source follower pair with current sink transistors 1490 and 1500 and generate the differential 320.

Slicer 130 consists of three stages of differential amplifiers with a source follower output. Transistors 330 and 340 constitute the first stage differential pair along with load resistors 1520 and 1530 and current sink transistor 1510. Transistors 1550 and 1560 constitute the second stage differential pair along with load resistors 1570 and 1580 and current sink transistor 1540. Transistors 1600 and 1610 constitute the first stage differential pair along with load resistors 1620 and 1630 and current sink transistor 1590. Transistors 1640 and 1650 constitute the source follower pair with current sink transistors 1660 and 1670 and generate the differential output 350.

Power for the circuit is provided at port 1690 and a ground is provided at port 1700.

The presence of various voltages at inputs 250 and 260 creates different amounts of current into transistor 270, thus resulting in varying amounts of current at current mirrors 280 and 290. This varying amounts of current results in various IR drops across resistors 230 and 240, thus resulting in various amounts of offset voltages.

Figure 3:
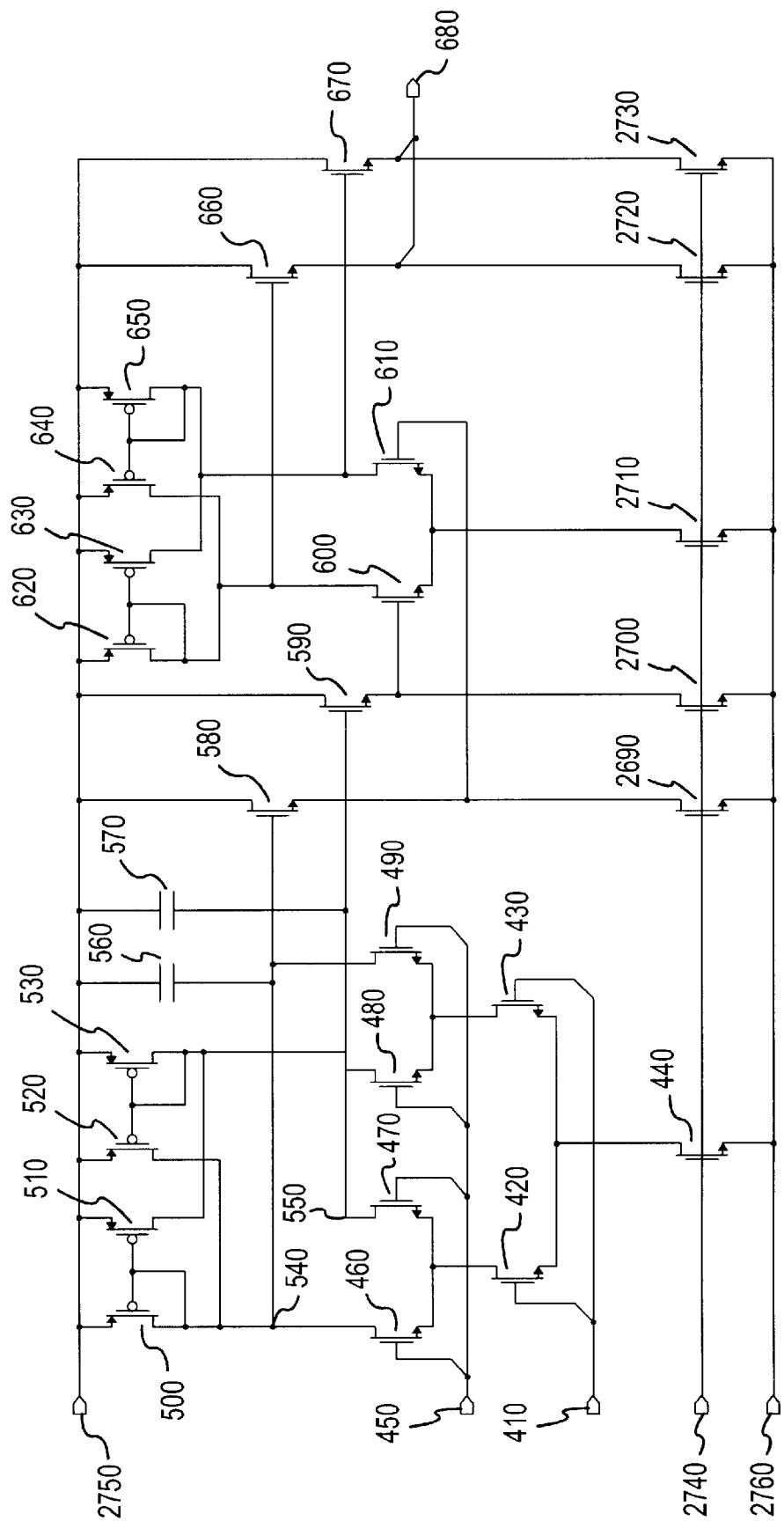
FIG. 3 is an illustration of a further portion of the circuit shown in FIG. 1.

FIG. 3 illustrates XOR gate 140, as illustrated in FIG. 1. The two inputs to the XOR gates are presented as differential inputs, input B on port 410 and input A on 450. Transistor 440 implements a current sink that is steered according to the input 410, presented as the differential voltage across the differential pair formed by transistors 420 and 430. This current is then steered according to input 450, presented as the differential voltage across the differential pair formed by either differential pair 460 and 470 or differential pair 480 and 490, depending on whether the current was steered through transistor 420 or 430.

The output of the XOR gate is generated across the load presented by transistors 500, 510, 520 or 530. The current is steered into either transistor 500 or 530, depending on the input signals A and B. Transistors 500 and 530 are set up as current mirrors such that they set the voltage at output nodes 540 and 550, respectively, to a low voltage value, while current mirror devices 510 and 520 pull the opposite node to a high voltage value. The voltage at nodes 540 and 550 are filtered by the capacitors 560 and 570, such that the differential voltage at nodes 540 and 550 are effectively the low pass filtered output of the XOR gate. This voltage is buffered by source followers 580 and 590 and presented as a differential input to a Schmitt trigger.

The Schmitt trigger input consists of a differential pair formed by transistor 600 and 610. Transistors 620, 630, 640 and 650 are set up as current mirror load. The output is buffered by source followers 660 and 670 and presented as a differential signal on port 680.

Port 2740 provides a bias Voltage that biases the current sink transistors 440, 2690, 2700, 2710, 2720, 2730. The voltage Vb is obtained by a reference current and a mirror transistor (not shown) scaled to the current sink transistors to obtain the desired drain currents.

Power for the circuit is provided at port 2750 and ground at port 2760.

Figure 4:
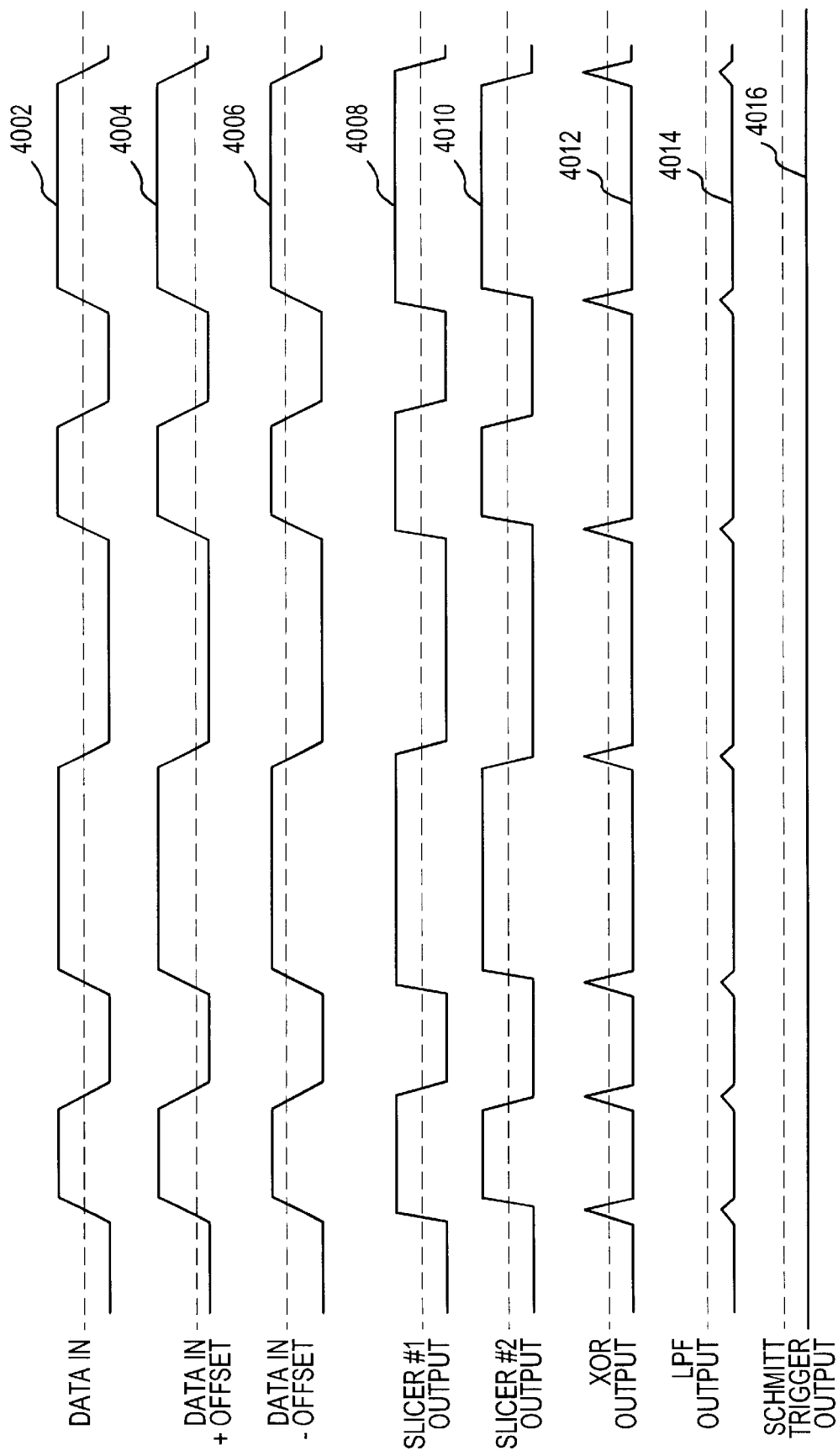
FIG. 4 shows the waveforms of various signals when a valid signal is input into the circuit.

FIG. 4 presents various waveforms depicting the operation of the an embodiment of the present invention when a valid signal is presented at input 102. Graph 4002 shows the data into input 102. Graphs 4004 and 4006 show the output from offset generator 110. Graph 4004 shows the input data plus the offset voltage, while graph 4006 shows the input data minus the offset voltage. Graph 4008 present the output from slicer 120 and graph 4010 presents the output from slicer 130. It can be seen that the output of slicer 120 transitions from low to high when the input to slicer 120 transitions from low to high. Slicer 130 operates in a similar manner.

The outputs from slicer 120 and 130 are propagated to XOR gate 140. The output of XOR gate 140 is shown in graph 4012. It can be seen that the output of XOR gate 140 is low (because the inputs to XOR gate 140 are both low) except the small time period when slicer 120 transitions from low to high while slicer 130 remains low. This short spike is filtered by low pass filer 150, as shown in graph 4014, and by Schmitt trigger 160, as shown in graph 4016. After smoothing, the signal remains steady at a logical low state, indicating the presence of a valid signal.

Figure 5:
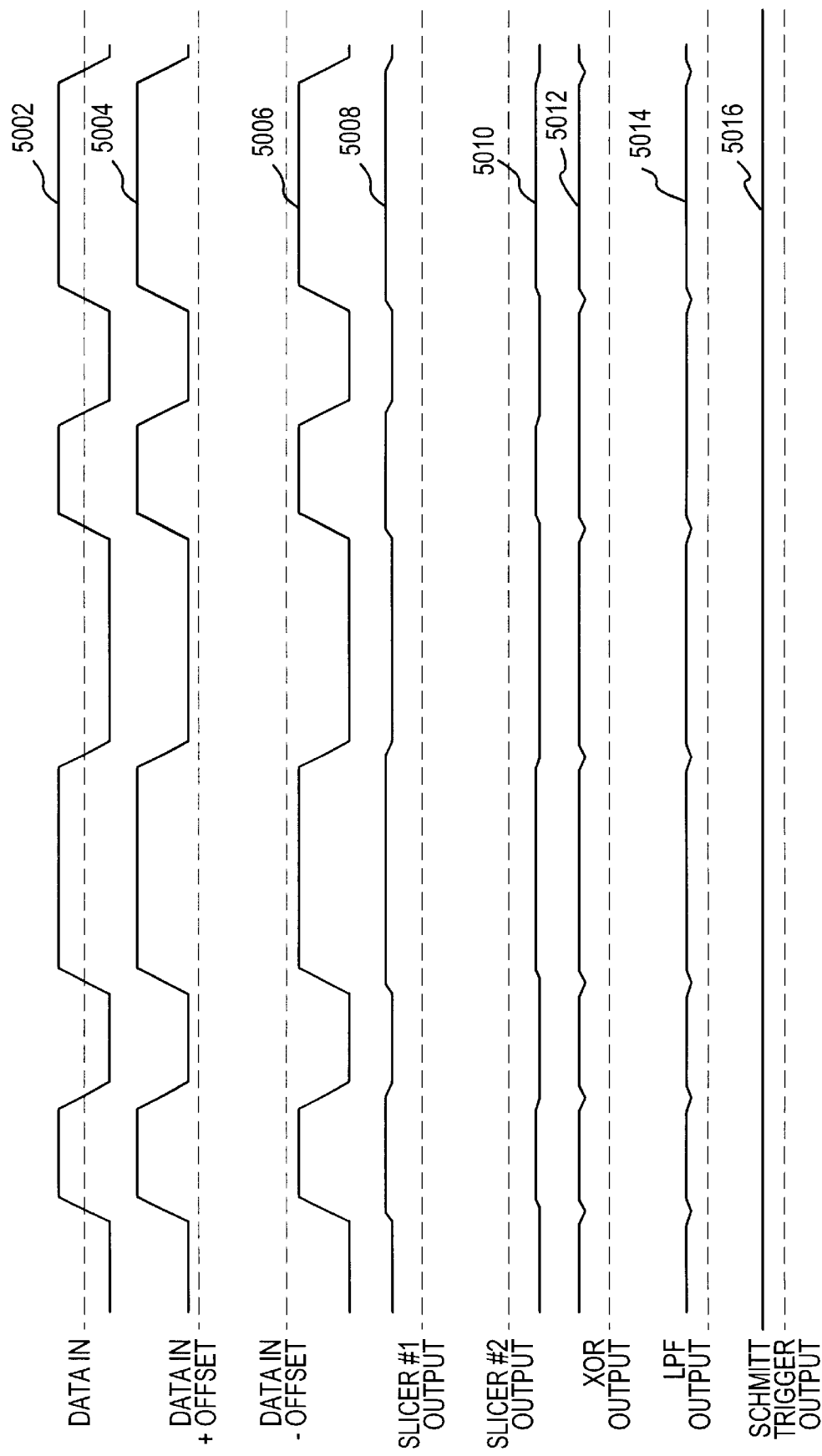
FIG. 5 shows the waveforms of various signals when an invalid signal is input into the circuit.

With reference to FIG. 5, various waveforms depicting the operation of the an embodiment of the present invention when a non-valid signal is presented at input 102. Graph 5002 shows the data into input 102. Graphs 5004 and 5006 show the output from offset generator 110. Graph 5004 shows the input data plus the offset voltage, while graph 5006 shows the input data minus the offset voltage. Graph 5008 present the output from slicer 120 and graph 5010 presents the output from slicer 130. It can be seen that the output of slicer 120 transitions from low to high when the input to slicer 120 transitions from low to high. Slicer 130 operates in a similar manner. As can be seen in comparison with FIG. 4, when there is no valid signal present on input 102, the outputs of offset generator 110 remain high or low and do not cross the zero line. Thus, the output of slicers 120 and 130 remain constant because of the lack of a zero crossing. Moreover, the output of slicer 120 is a high signal while the output of slicer 130 is a low signal.

The outputs from slicer 120 and 130 are propagated to XOR gate 140. The output of XOR gate 140 is shown in graph 5012. It can be seen that the output of XOR gate 140 is high because the inputs to XOR gate 140 are not equal. There are slight spikes in the output of XOR gate 140 due to the small fluctuations in the signal. These short spikes are filtered by low pass filer 150, as shown in graph 5014, and by Schmitt trigger 160, as shown in graph 5016. After smoothing, the signal remains steady at a logical high state, indicating the absence of a valid signal.

As can be seen from FIG. 5, the ideal offset voltage is one that is not sufficient to activate the circuit. Such an offset, when added to noise, will result in an output from circuit 100 that indicates the lack of a valid input signal.

Although the present invention is set forth herein in the context of the appended drawing figures, it should be appreciated that the invention is not limited to the specific form shown. Various modifications, variations, and enhancements in the design and arrangement of the method and apparatus set forth herein, may be made without departing from the spirit and scope of the present invention. For example, while the present invention has been illustrated through the use of differential signals, the present invention may also be used with single-ended signals as well. In addition, while the invention describes the use of an XOR gate, it should be understood that an XNOR gate, which returns the same results as an XOR gate, except inverted, can be used to return a similar result. In addition, the present invention can be used both as a "signal detection" circuit and as a "loss of signal" detection circuit.

We claim:

1. An apparatus for detecting the presence of a valid signal comprising:
    an offset generator configured to add a predetermined voltage to an input signal and generate a first output, and further configured to subtract a predetermined voltage from the input signal and to generate a second output;
    a first comparator coupled to the offset generator configured to compare the input signal to the first output signal;
    a second comparator coupled to the offset generator configured to compare the input signal to the second output signal; and
    a digital logic gate coupled to the first and second comparators, wherein said digital logic gate is an XOR gate.

2. The apparatus of claim 1 further comprising:
    a low pass filter.

3. The apparatus of claim 1 further comprising a Schmitt trigger.

4. The apparatus of claim 3 wherein said Schmitt trigger comprises a differential pair of transistors coupled to a source follower circuit.

5. The apparatus of claim 1 wherein
    said predetermined voltage is less than a voltage indicating a valid voltage signal.

6. The apparatus of claim 1 wherein said first comparator comprises a first data slicer.

7. The apparatus of claim 6 wherein said first data slicer comprises a differential amplifier.

8. The apparatus of claim 7 wherein said first data slicer further comprises a source follower.

9. The apparatus of claim 6 wherein said first data slicer is inverting.

10. The apparatus of claim 1, wherein said second comparator comprises a second data slicer.

11. The apparatus of claim 10 wherein said second data slicer comprises a differential amplifier.

12. The apparatus of claim 11 wherein said second data slicer further comprises a source follower.

13. The apparatus of claim 10 wherein said second data slicer is inverting.

14. The apparatus of claim 1 wherein said offset generator is configured such that the predetermined voltage is adjustable.

15. The apparatus of claim 14 wherein the adjustment of said predetermined voltage is accomplished via the input of a control voltage at a terminal.

16. The apparatus of claim 1 wherein the input signal is a single-ended signal.

17. The apparatus of claim 16 wherein said threshold voltage is a single-ended voltage with a reference voltage.

18. The apparatus of claim 16 wherein said first and second comparators are configured for operation in a single-ended mode.

19. The apparatus of claim 1 wherein the input signal is a differential signal.

20. The apparatus of claim 19 wherein said predetermined voltage is a differential offset.

21. The apparatus of claim 20 wherein said first and second comparators are configured for operation in a differential mode.

22. The apparatus of claim 1 wherein said XOR gate comprises a plurality of differential transistor pairs.

23. An apparatus for detecting the presence of a valid signal comprising:
   an offset generator configured to add a predetermined voltage to an input signal and generate a first output, and further configured to subtract a predetermined voltage from the input signal and to generate a second output;
   a first comparator coupled to the offset generator configured to compare the input signal to the first output signal;
   said first comparator being a first data slicer comprising a differential amplifer;
   said first data slicer further comprising a source follower;
   a second comparator coupled to the offset generator configured to compare the input signal to the second output signal; and
   a digital logic gate coupled to the first and second comparators.

24. An apparatus for detecting the presence of a valid signal comprising:
   an offset generator configured to add a predetermined voltage to an input signal and generate a first output, and further configured to subtract a predetermined voltage from the input signal and to generate a second output;
   a first comparator coupled to the offset generator configured to compare the input signal to the first output signal;
   a second comparator, being a second data slicer, coupled to the offset generator configured to compare the input signal to the second output signal; and
   a digital logic gate coupled to the first and second comparators;
   wherein said second data slicer comprises a differential amplifier and a source follower.

25. An apparatus for detecting the presence of a valid signal comprising:
   an offset generator configured to add a predetermined voltage to an input signal and generate a first output, and further configured to subtract a predetermined voltage from the input signal and to generate a second output, said offset generator being configured such that the predetermined voltage is adjustable, wherein the adjustment of said predetermined voltage is accomplished via the input of a control voltage at a terminal;
   a first comparator coupled to the offset generator configured to compare the input signal to the first output signal;
   a second comparator coupled to the offset generator configured to compare the input signal to the second output signal; and
   a digital logic gate coupled to the first and second comparators.

26. An apparatus for detecting the presence of a valid signal comprising:
   an offset generator configured to add a predetermined voltage to an input signal and generate a first output, and further configured to subtract a predetermined voltage from the input signal and to generate a second output;
   a first comparator coupled to the offset generator configured to compare the input signal to the first output signal;
   a second comparator coupled to the offset generator configured to compare the input signal to the second output signal;
   a digital logic gate coupled to the first and second comparators; and
   a Schmitt trigger;
   wherein said Schmitt trigger comprises a differential pair of transistors coupled to a source follower circuit.

27. An apparatus for detecting the presence of a valid signal comprising:
   an offset generator configured to add a predetermined voltage to an input signal and generate a first output, and further configured to subtract a predetermined voltage from the input signal and to generate a second output;
   a first comparator coupled to the offset generator configured to compare the input signal to the first output signal;
   a second comparator coupled to the offset generator configured to compare the input signal to the second output signal; and
   a digital logic gate coupled to the first and second comparators, wherein said digital logic gate is an XNOR gate.

28. The apparatus of claim 27 wherein said XNOR gate comprises a plurality of differential transistor pairs.

29. The apparatus of claim 27 further comprising:
   a low pass filter.

30. The apparatus of claim 27 further comprising a Schmitt trigger.

31. The apparatus of claim 30 wherein said Schmitt trigger comprises a differential pair of transistors coupled to a source follower circuit.

32. The apparatus of claim 27 wherein
   said predetermined voltage is less than a voltage indicating a valid voltage signal.

33. The apparatus of claim 27 wherein said first comparator comprises a first data slicer.

34. The apparatus of claim 33 wherein said first data slicer comprises a differential amplifier.

35. The apparatus of claim 34 wherein said first data slicer further comprises a source follower.

36. The apparatus of claim 33 wherein said first data slicer is inverting.

37. The apparatus of claim 27 wherein said second comparator comprises a second data slicer.

38. The apparatus of claim 37 wherein said second data slicer comprises a differential amplifier.

39. The apparatus of claim 38 wherein said second data slicer further comprises a source follower.

40. The apparatus of claim 37 wherein the second data slicer is inverting.

41. The apparatus of claim 27 wherein said offset generator is configured such that the predetermined voltage is adjustable.

42. The apparatus of claim 41 wherein the adjustment of said predetermined voltage is accomplished via the input of a control voltage at a terminal.

43. The apparatus of claim 27 wherein the input signal is a single-ended signal.

44. The apparatus of claim 43 wherein said threshold voltage is a single-ended voltage with a reference voltage.

45. The apparatus of claim 43 wherein said first and second comparators are configured for operation in a single-ended mode.

46. The apparatus of claim 27 wherein the input signal is a differential signal.

47. The apparatus of claim 46 wherein said predetermined voltage is a differential offset.

48. The apparatus of claim 47 wherein said first and second comparators are configured for operation in a differential mode.

49. The apparatus of claim 27 wherein said XNOR gate comprises a plurality of differential transistor pairs.

* * * * *